US012610468B2

(12) United States Patent
Jung et al.

(10) Patent No.: US 12,610,468 B2
(45) Date of Patent: Apr. 21, 2026

(54) HYBRID CIRCUIT BOARD AND BATTERY PACK HAVING SAME

(71) Applicant: SAMSUNG SDI CO., LTD., Yongin-si (KR)

(72) Inventors: Baeck Gi Jung, Yongin-si (KR); Chul Jung Yun, Yongin-si (KR); Jae Pil Ahn, Yongin-si (KR); Young Hwan Kwon, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 936 days.

(21) Appl. No.: 17/654,745

(22) Filed: Mar. 14, 2022

(65) Prior Publication Data

US 2022/0304158 A1 Sep. 22, 2022

(30) Foreign Application Priority Data

Mar. 18, 2021 (KR) ........................ 10-2021-0035284

(51) Int. Cl.
*H01M 50/519* (2021.01)
*H01M 10/48* (2006.01)
(Continued)

(52) U.S. Cl.
CPC .......... *H05K 1/147* (2013.01); *H01M 10/482* (2013.01); *H01M 10/486* (2013.01);
(Continued)

(58) Field of Classification Search
None
See application file for complete search history.

(56) References Cited

U.S. PATENT DOCUMENTS 10,704,961 B2 7/2020 Wang et al.
10,761,142 B2 9/2020 Ota et al.
(Continued)

FOREIGN PATENT DOCUMENTS

CN 107871839 A 4/2018
CN 109524609 A 3/2019
(Continued)

OTHER PUBLICATIONS

European Search Report issued in corresponding application No. EP 22132941.3, dated Sep. 14, 2022, 9 pages.
(Continued)

*Primary Examiner* — Ula C Ruddock
*Assistant Examiner* — Maria F Orozco
(74) *Attorney, Agent, or Firm* — Womble Bond Dickinson (US) LLP

(57) ABSTRACT

Embodiments of the present disclosure relate to a hybrid circuit board and a battery pack having the same. The battery pack includes: a plurality of battery cells arranged in one direction, each of the battery cells including a positive electrode terminal and a negative electrode terminal; a plurality of busbars electrically connected to the positive electrode terminal or the negative electrode terminal of each of the battery cells; and a hybrid circuit board including a rigid substrate and a flexible substrate that is coupled to the rigid substrate and is electrically connected to the busbars. The rigid substrate is arranged between the busbars and the flexible substrate.

12 Claims, 6 Drawing Sheets

(51) Int. Cl.
　　*H01M 50/516*　　　(2021.01)
　　*H05K 1/02*　　　　(2006.01)
　　*H05K 1/14*　　　　(2006.01)

(52) U.S. Cl.
　　CPC ....... *H01M 50/516* (2021.01); *H01M 50/519*
　　　　　(2021.01); *H05K 1/028* (2013.01); *H05K*
　　　　　*2201/10151* (2013.01); *H05K 2201/10272*
　　　　　(2013.01); *H05K 2201/10984* (2013.01)

(56) References Cited

U.S. PATENT DOCUMENTS

| | | | |
|---|---|---|---|
| 2014/0120401 A1 | 5/2014 | Shin et al. | |
| 2014/0370366 A1 | 12/2014 | Higuchi et al. | |
| 2018/0088179 A1 | 3/2018 | Ota et al. | |
| 2018/0090735 A1* | 3/2018 | Huff | H01M 10/486 |
| 2019/0027731 A1* | 1/2019 | Zeng | H01M 50/51 |
| 2019/0088912 A1 | 3/2019 | Goh et al. | |
| 2019/0237817 A1* | 8/2019 | Hammerschmied | H01M 10/425 |

| | | | |
|---|---|---|---|
| 2019/0348720 A1* | 11/2019 | Oh | H01M 50/567 |
| 2020/0365866 A1* | 11/2020 | Lin | H05K 1/028 |
| 2022/0006159 A1 | 1/2022 | Takahashi et al. | |
| 2022/0013868 A1* | 1/2022 | Takahashi | H01M 50/578 |

FOREIGN PATENT DOCUMENTS

| | | | |
|---|---|---|---|
| KR | 10-0837624 B1 | 10/2007 | |
| KR | 10-1956932 B1 | 5/2014 | |
| KR | 10-2017674 B1 | 4/2019 | |
| WO | WO 2020/105399 A1 | 5/2020 | |
| WO | WO-2020105400 A1 * | 5/2020 | H01M 50/50 |

OTHER PUBLICATIONS

Chinese Notification of First Office Action, for Patent Application No. 202210270944.5, dated Feb. 27, 2025, 6 pages.
Chinese Notice of Allowance issued in corresponding application No. CN 202210270944.5, dated Mar. 13, 2026, 7 pages.

* cited by examiner

HYBRID CIRCUIT BOARD AND BATTERY PACK HAVING SAME

CROSS-REFERENCE TO RELATED APPLICATION

This application claims priority to and the benefit of Korean Patent Application No. 10-2021-0035284, filed on Mar. 18, 2021, in the Korean Intellectual Property Office, the content of which is herein incorporated by reference in its entity.

BACKGROUND

1. Field

Aspects of embodiments of the present disclosure relate to a hybrid circuit board and a battery pack having the same.

2. Description of the Related Art

Generally, a battery pack includes a plurality of battery cells, a busbar electrically connecting the battery cells to the outside (e.g., to an outside load), and a rigid circuit board that is electrically connected to the busbar and on which various circuits and components are mounted.

The busbar is mounted on the rigid circuit board by using bolts and insert nuts, which may cause the height of the battery pack to be increased. In addition, to absorb swelling of a battery cell, a separate terminal having a swelling-absorption structure should be bolted between the rigid circuit board and the battery cell. Further, a tox clinching process should be used for connecting the busbar, and thus, there are problems in that the structure of the battery pack and battery module becomes complicated, the costs increase, and it may be difficult to reduce the height of the module.

The above information disclosed in this Background section is only for enhancement of understanding of the background of the described technology, and therefore, it may contain information that does not form the prior art that is already known to a person of ordinary skill in the art.

SUMMARY

The present disclosure provides a hybrid circuit board having a rigidity-reinforcement and swelling-absorption structure and a battery pack having the same.

The present disclosure also provides a hybrid circuit board having a simple busbar connection structure that avoids increasing the height of a module, and a battery pack having the same.

A hybrid circuit board according to an embodiment of the present disclosure includes: a flexible substrate including (or made of) a flexible material that is configured to be electrically connected to a plurality of busbars, which electrically connect a plurality of battery cells; and a rigid substrate including (or made of) a rigid material that is coupled to the flexible substrate to support the flexible substrate.

The flexible substrate may include a plurality of tab connection portions along an edge thereof, and a substrate tab may be electrically connected to each of the tab connection portions and the busbars.

The flexible substrate may have a first shape portion at both sides of the tab connection portion, and the first shape may be concavely cut inwardly from a corresponding edge of the flexible substrate.

The flexible substrate may have a second shape portion extending from a corresponding edge of the flexible substrate in an 'S' shape and integrally formed with the tab connection portion.

One end of the substrate tab may be soldered to the tab connection portion, and the other end thereof may be laser-welded to the busbar.

The flexible circuit board may further include a sensor connection portion extending in an 'S' shape from one of the edges of the flexible substrate. The sensor connection portion may include a temperature sensor configured to measure the temperature of at least one of the battery cells, a foam pad accommodating the temperature sensor, and a metal tab coupled to the foam pad and connected to the temperature sensor and the at least one battery cell.

A battery pack, according to an embodiment of the present disclosure, includes: a plurality of battery cells arranged in one direction, each of the battery cells including a positive electrode terminal and a negative electrode terminal; a plurality of busbars electrically connected to the positive electrode terminal or the negative electrode terminal of each of the battery cells; and a hybrid circuit board including a rigid substrate and a flexible substrate that is coupled to the rigid substrate and is electrically connected to the busbars. The rigid substrate is arranged between the busbars and the flexible substrate.

The flexible substrate may include a plurality of tab connection portions along edges thereof, and a substrate tab may be electrically connected to each of the tab connection portions and the busbar.

The flexible substrate may have a first shape portion formed at both sides of the tab connection portion, and the first shape may be concavely cut inwardly from a corresponding edge of the flexible substrate.

The flexible substrate may have a second shape portion extending from one of the edges of the flexible substrate in an 'S' shape and integrally formed with the tab connection portion.

One end of the substrate tab may be soldered to the tab connection portion, and the other end thereof may be laser-welded to the busbar.

The flexible substrate may include a sensor connection portion extending in an 'S' shape from one of the edges of the flexible substrate. The sensor connection portion may include a temperature sensor configured to measure the temperature of at least one of the battery cells, a foam pad accommodating the temperature sensor, and a metal tab coupled to the foam pad and connected to the temperature sensor and the battery cell.

DETAILED DESCRIPTION

Figure 1:
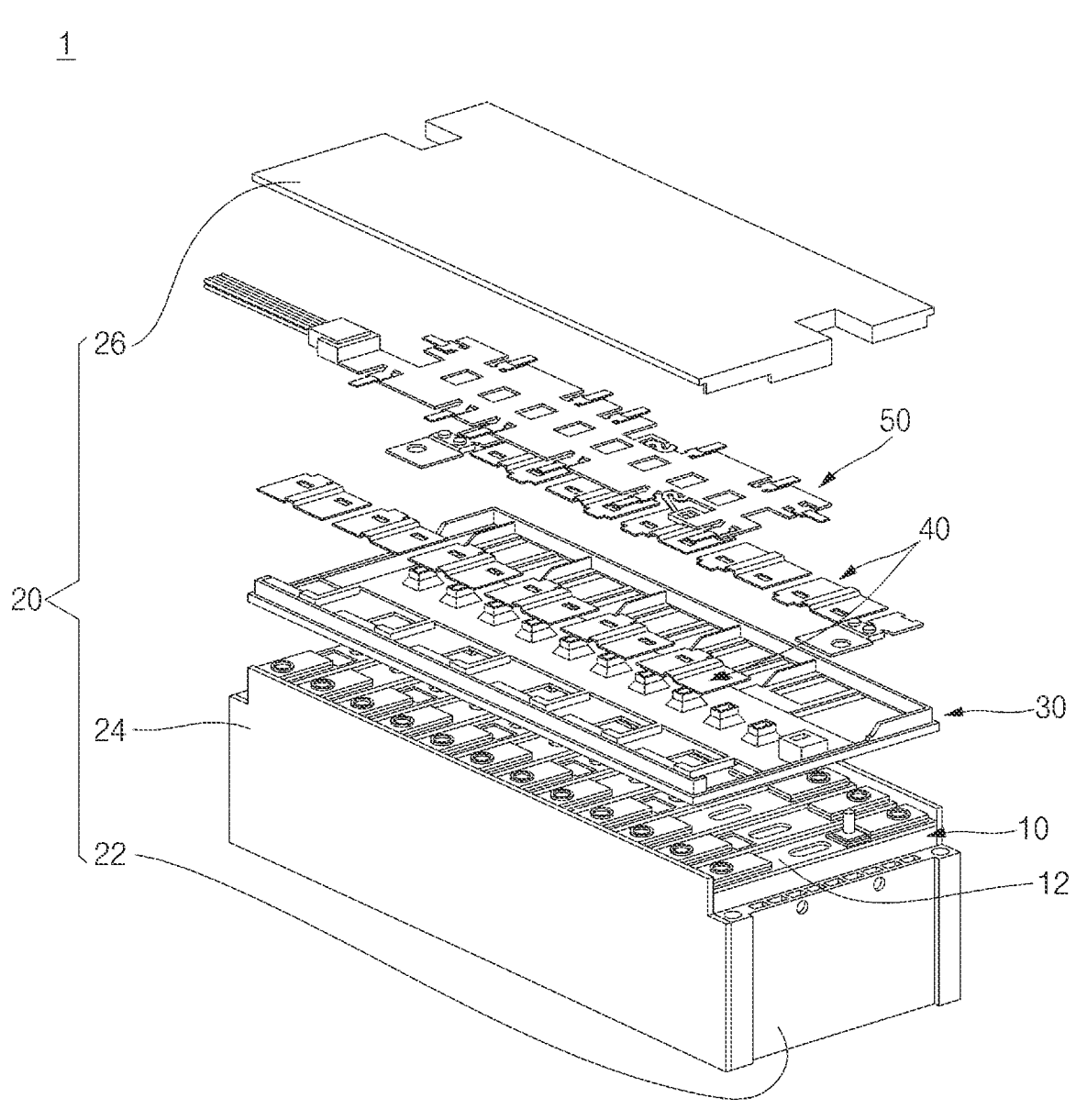
FIG. 1 is a partially exploded perspective view of a battery pack according to an embodiment of the present disclosure.

Embodiments of the present disclosure are provided to more completely explain the present disclosure, and the following embodiments may be embodied in many different forms and should not be construed as being limited to the embodiments set forth herein. Rather, these embodiments are provided so that this disclosure will be thorough and complete and will convey the aspects and features of the present disclosure to a person skilled in the art.

In addition, in the accompanying drawings, sizes or thicknesses of various components may be exaggerated for brevity and clarity. Like numbers refer to like elements throughout. As used herein, the term "and/or" includes any and all combinations of one or more of the associated listed items. In addition, it will be understood that when an element A is referred to as being "connected to" an element B, the element A can be directly connected to the element B or an intervening element C may be present therebetween such that the element A and the element B are indirectly connected to each other.

The terminology used herein is for the purpose of describing particular embodiments and is not intended to be limiting of the disclosure. As used herein, the singular forms are intended to include the plural forms as well, unless the context clearly indicates otherwise. It will be further understood that the terms that the terms "have," "comprise," or "include" and variations thereof, such as "having," "comprising," or "including," when used in this specification, specify the presence of stated features, numbers, steps, operations, elements, and/or components but do not preclude the presence or addition of one or more other features, numbers, steps, operations, elements, components, and/or groups thereof.

It will be understood that, although the terms first, second, etc. may be used herein to describe various members, elements, regions, layers, and/or sections, these members, elements, regions, layers, and/or sections should not be limited by these terms. These terms are only used to distinguish one member, element, region, layer and/or section from another. Thus, for example, a first member, a first element, a first region, a first layer, and/or a first section discussed below could be termed a second member, a second element, a second region, a second layer, and/or a second section without departing from the teachings of the present disclosure.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the element or feature in the figures is turned over, elements described as "below" or "beneath" other elements or features would then be oriented "on" or "above" the other elements or features. Thus, the exemplary term "below" can encompass both an orientation of above and below, etc. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Hereinafter, a hybrid circuit board and a battery pack having the same according to embodiments of the present disclosure will be described, in detail, with reference to the accompanying drawings.

Figure 2:
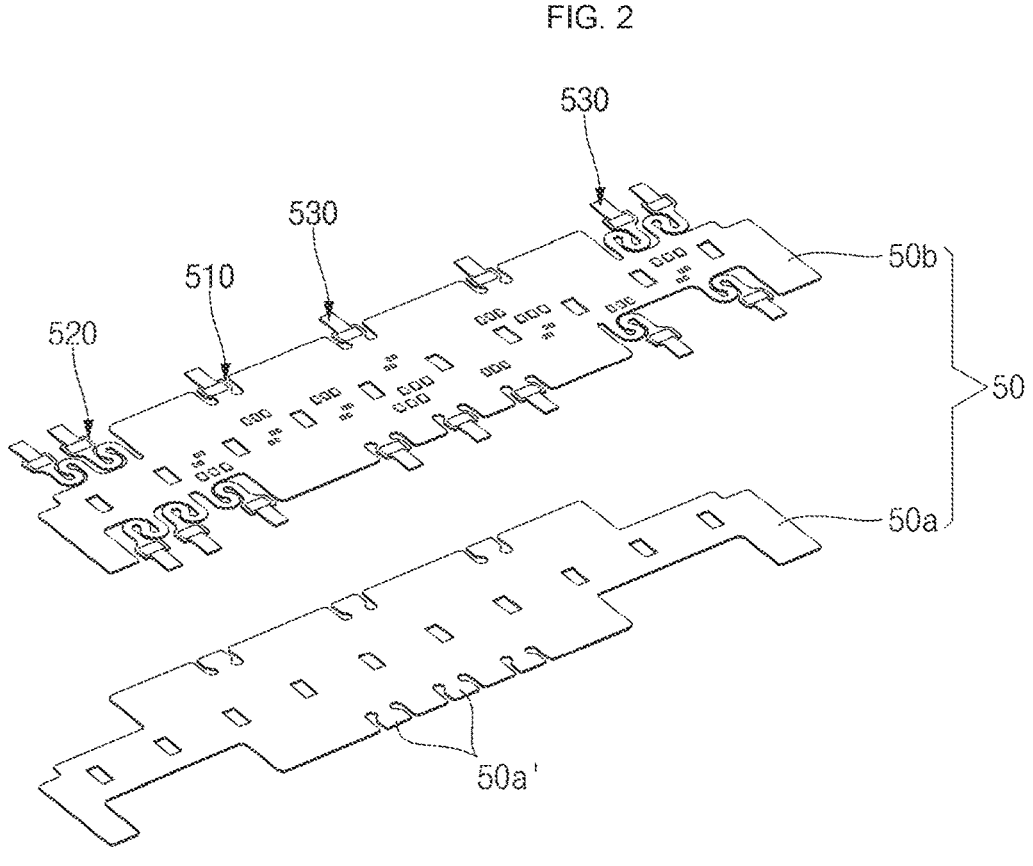
FIG. 2 is an exploded perspective view of the hybrid circuit board shown in FIG. 1.
Figure 3:
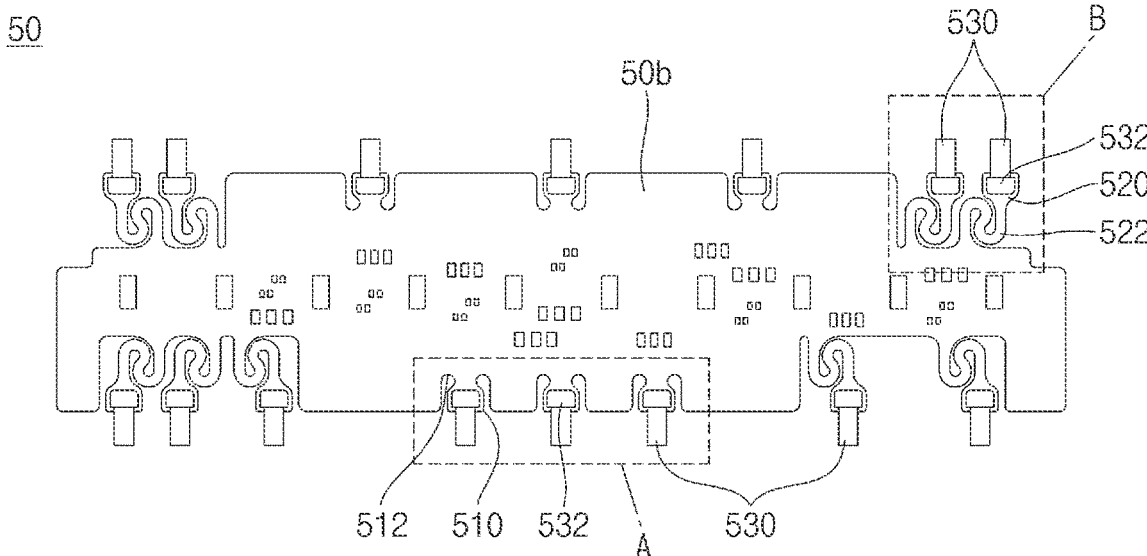
FIG. 3 is a plan view of the hybrid circuit board shown in FIG. 2.
Figure 4:
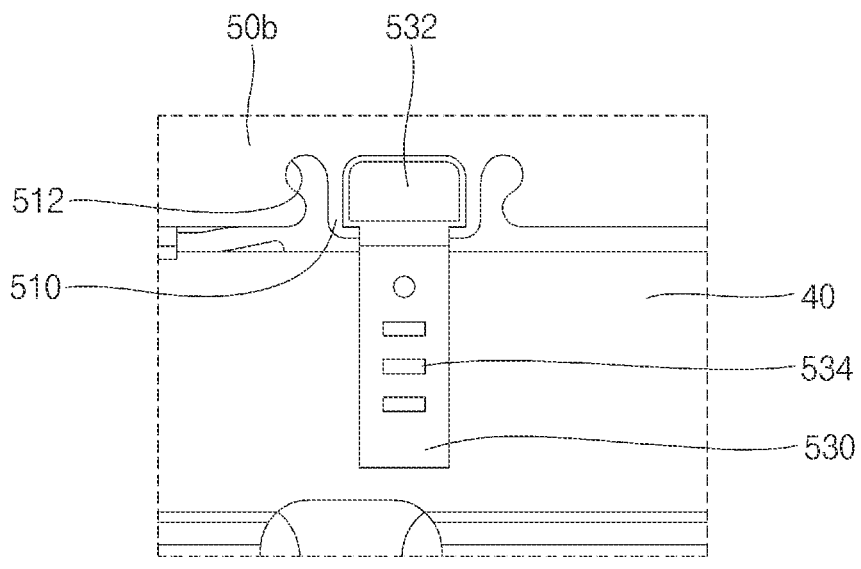
FIG. 4 is an enlarged plan view of the portion "A" of FIG. 3.
Figure 5:
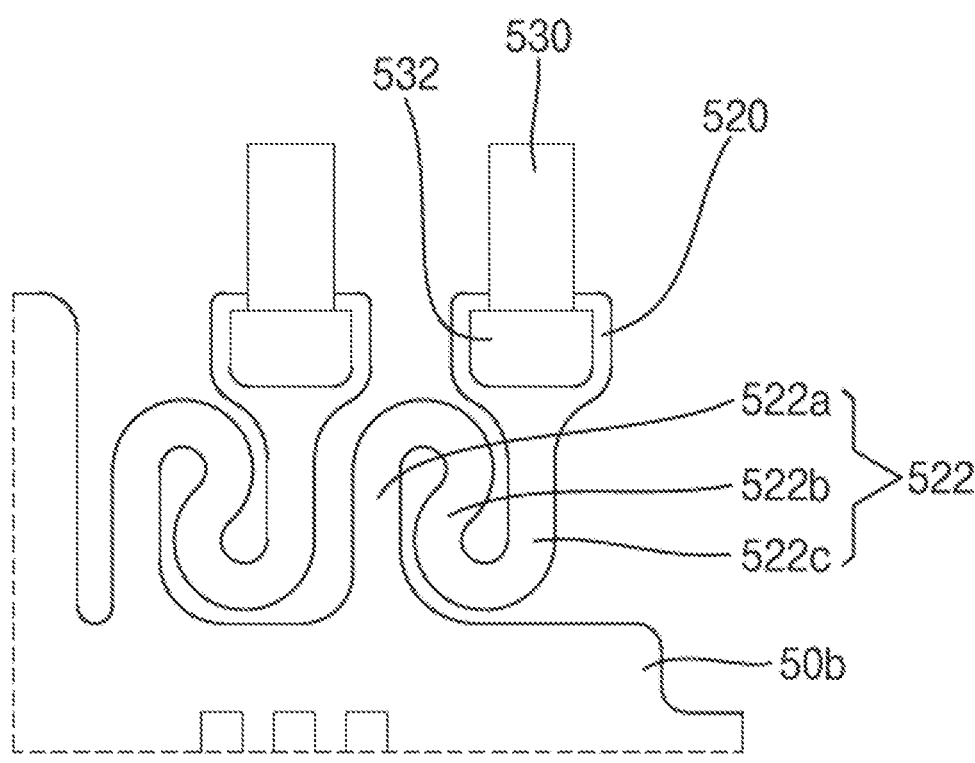
FIG. 5 is an enlarged plan view of the portion "B" of FIG. 3.

FIG. 1 is a partially exploded perspective view of a battery pack according to an embodiment of the present disclosure, FIG. 2 is an exploded perspective view of the hybrid circuit board shown in FIG. 1, FIG. 3 is a plan view of the hybrid circuit board shown in FIG. 2, FIG. 4 is an enlarged plan view of the portion "A" of FIG. 3, and FIG. 5 is an enlarged plan view of the portion "B" of FIG. 3.

As shown in FIG. 1, a battery pack 1 according to an embodiment of the present disclosure includes a plurality of battery cells 10, a cell frame 20 which aligns and supports the battery cells 10, a plurality of busbars 40, which are electrically connected to the battery cells 10, and a busbar holder 30, which supports the busbars 40. The battery pack 1 may further include a hybrid circuit board 50 on which various circuits and components are mounted. The busbars 40 may be electrically connected to the hybrid circuit board 50, and the hybrid circuit board 50 may be electrically connected to the outside of the battery pack 1 through a separate connector. The battery pack 1 may be referred to as a battery module.

The battery cells 10 may have a rectangular parallelepiped shape, and a plurality of battery cells 10 may be arranged in a line along a direction (e.g., a predetermined direction). Here, each of the battery cells 10 may be arranged so that their relatively wide plate surfaces face each other. The cell frame 20 is provided to align the battery cells 10. Each of the battery cells 10 may include a rectangular parallelepiped-shaped case, an electrode assembly accommodated together with an electrolyte in the case, and a cell cap 12 for sealing the case.

The electrode assembly may be formed by sequentially winding or stacking a negative electrode plate, a separator, and a positive electrode plate. A negative electrode active material, such as graphite or carbon, may be applied or coated on the negative electrode plate. The negative electrode plate may be formed of a metal foil, such as copper, copper alloy, nickel, or nickel alloy. An active material, such as a transition metal oxide, may be applied or coated on the positive electrode plate. The positive electrode plate may be formed of a metal foil, such as aluminum or an aluminum alloy. An uncoated region, that is, an area to which an active material is not applied, may be formed on the negative electrode plate and the positive electrode plate, respectively. A negative electrode tab may be connected to the negative electrode uncoated region, and a positive electrode tab may be connected to the positive electrode uncoated region. The negative electrode tab and the positive electrode tab, connected in this way, may be respectively electrically connected to the negative electrode terminal and the positive electrode terminal formed in the cell cap 12. The negative and positive electrode terminals on the cell cap 12 are electrically connected to the busbars 40.

The cell frame 20 includes a pair of end plates 22 that are in contact with the battery cells 10 at both ends along the arrangement direction of the battery cells 10, a pair of side plates 24 coupled orthogonally to the end plates 22, and a top plate 26 coupled to an upper portion of the hybrid circuit board 50. On the basis of FIG. 1, a bottom plate of the cell frame 20 is provided on the lower portion of the battery cells 10 to support the battery cells 10 from the lower portion. On the basis of FIG. 1, the end plates 22 support the battery cells 10 in the front-rear direction, the side plates 24 support the battery cells 10 in the left-right direction, and the top plate 26 support the battery cells 10 in the upper direction, respectively. The end plate 22, the side plates 24, the top plate 26, and the bottom plate (not shown) are coupled to one another to form a substantially rectangular parallelepiped frame, and the battery cells 10, the busbar holder 30 and the busbars 40, and the hybrid circuit board 50, are accommodated therein.

The busbar holder 30 may be seated on top of the cell cap 12 on the basis of FIG. 1. The busbar holder 30 is a substantially rectangular plate, and a plurality of openings (e.g., through holes), through which the positive and negative electrode terminals of the cell cap 12 are exposed, may be formed therein. The busbar holder 30 may be made of an insulating material. When the positive electrode terminal and the negative electrode terminal are exposed through the openings formed in the busbar holder 30, the busbar 40 are electrically connected to the exposed positive electrode terminal and the negative electrode terminal.

The busbar 40 may electrically connect the positive electrode terminal and the negative electrode terminal (e.g., the positive electrode terminal of one of the battery cells 10 to the negative electrode terminal of another one of the battery cells 10). The busbar 40 may connect the plurality of battery cells 10 in series and/or in parallel. To this end, a plurality of busbars 40 may be provided. In one example, the busbars 40 may electrically connect non-adjacent battery cells 10 from among the battery cells 10 arranged in a row. In other embodiments, the busbars 40 may electrically connect the positive electrode terminal of one battery cell 10 and a positive electrode terminal or a negative electrode terminal of another battery cell 10. In addition, the busbar 40 may electrically connect the negative electrode terminal of one battery cell 10 and a positive electrode terminal or a negative electrode terminal of another battery cell 10. The busbar 40 may be connected to the positive electrode terminal and the negative electrode terminal by welding or the like. Areas other than the busbar 40 and the positive and negative electrode terminals may be insulated by the busbar holder 30. The hybrid circuit board 50 is disposed between the busbar(s) 40 and the top plate 26.

As shown in FIG. 2, the hybrid circuit board 50 may include a rigid substrate 50*a* and a flexible substrate 50*b*.

The rigid substrate 50*a* is coupled to the flexible substrate 50*b* to support the flexible substrate 50*b* and to reinforce (or improve) rigidity. The rigid substrate 50*a* may be simply formed of a reinforcing material for reinforcement without circuit mounting. In other embodiments, the rigid substrate 50*a* may be a printed circuit board (PCB) on which a circuit is mounted. Because the rigid substrate 50*a* supports the flexible substrate 50*b*, it may have a shape similar to that of the flexible substrate 50*b*. The rigid substrate 50*a* may have the same size as the flexible substrate 50*b* or a slightly smaller size. The rigid substrate 50*a* may have a substantially rectangular shape and may be disposed so that a long side direction coincides with an arrangement direction of the battery cells 10. On the basis of FIG. 1, the flexible substrate 50*b* is coupled to the upper portion of the rigid substrate 50*a*.

The flexible substrate 50*b* is a substrate made of a flexible material having lower strength than the rigid substrate 50*a*. The flexible substrate 50*b* may be (or may be referred to as) a flexible printed circuit assembly (FPCA) or a flexible printed circuit board (FPCB). In the flexible substrate 50*b*, various parts (or components or circuits) for measuring state information of the battery cells 10, such as voltages and/or temperatures of the battery cells 10, and various parts (or components or circuits) for controlling and/or managing the battery cells 10, may be mounted.

As shown in FIGS. 2 and 3, the flexible substrate 50*b* may have a substantially rectangular shape, and a first tab connection portion 510 and a second tab connection portion 520 may be formed at edges thereof in the long side (or length) direction. A substrate tab 530 is connected to the first tab connection portion 510 and the second tab connection portion 520, respectively. The flexible substrate 50*b* may be disposed such that the long side direction coincides with an arrangement direction of the battery cells 10. Because the flexible substrate 50*b* is to be connected to the busbars 40, the flexible substrate 50*b* should cover a certain portion (or size) or more of the area of the busbar holder 30. The flexible substrate 50*b* may have a different size than the busbar holder 30 but may have a size sufficient to be at least adjacent to the installation area for the busbars 40 for a smooth connection with the busbars 40. For example, the flexible substrate 50*b* may have a short side (or width) length corresponding to an interval between the left busbars 40 and the right busbars 40 shown in FIG. 1. In addition, the flexible substrate 50*b* may have a long side length equal to the sum of the widths of the left or right busbars 40 in the arrangement direction of the battery cells 10.

As shown in FIGS. 2 and 3, a plurality of first and second tab connection portions 510 and 520 may be formed on the edges of the flexible substrate 50*b* in the longitudinal (or long side or length) direction. However, the first tab connection portion 510 and the second tab connection portion 520 may also be formed on the edges of the flexible substrate 50*b* in the short side (or width) direction.

As shown in FIGS. 2 to 4, the first tab connection portion 510 is a portion of the flexible substrate 50*b* to which the substrate tab 530, which is electrically connected to the busbar 40, is connected. The first tab connection portion 510 may be formed to have a size the same as or slightly larger than the size of a portion to which the substrate tab 530 is welded (hereinafter, referred to as a first welding portion). A first shape portion 512 that is cut in an approximately water-droplet shape may be formed in the flexible substrate 50*b* at both sides of the first tab connection portion 510.

The first shape portion 512 is concavely cut inwardly from an edge of the flexible substrate 50*b* in the long side direction and is provided on both sides of the first tab connection portion 510. Because the first tab connection portion 510 is a free end due to the first shape portion 512 and is a flexible material, the first tab connection portion 510 can move with a degree of freedom in the vertical, horizontal, and horizontal directions, on the basis of FIG. 1. The first tab connection portion 510 is connected to the busbar 40 by the substrate tab 530, and the busbar 40 is connected to the cell cap 12. Therefore, even if vibration is transmitted to the first tab connection portion 510 when swelling occurs in the battery cell 10, the swelling can be absorbed by the first shape portion 512. Accordingly, damage to the first tab connection portion 510 or damage to connection portions of the substrate tab 530 and the busbar 40 can be mitigated or prevented. The first shape portion 512 for absorbing swelling may be implemented in a different shape depending on a distance from the busbar 40 or interference with the busbar holder 30.

As shown in FIGS. 2, 3, and 5, the second tab connection portion 520, to which the substrate tab 530 is connected, may be formed on the flexible substrate 50b, and a second shape portion 522 having an approximately 'S' shape may be provided. For example, the second shape portion 522 includes an extension portion 522a extending in a straight line from one end of the edge of the flexible substrate 50b, a curved portion 522b integrally formed with the extension portion 522a and having an approximately 'S' curve shape, and a connection portion 522c formed integrally with the curved portion 522b and formed in a straight line to be connected to the second tab connection portion 520. The second tab connection portion 520, to which the substrate tab 530 is connected, is formed at an end of the connection portion 522c of the second shape portion 522. In addition, the second shape portion 522 has a width smaller than the size of the second tab connection portion 520 and is spaced apart from the end of the flexible substrate 50b. Therefore, because the second tab connection portion 520 becomes a free end due to the second shape portion 522 and is a flexible material, the second tab connection portion 520 can move with a degree of freedom in the vertical, horizontal, left, and right directions, on the basis of FIG. 1. Accordingly, swelling of the battery cells 10 may also be absorbed by the second shape portion 522.

As such, the first tab connection portion 510 should be able to flow with a degree of freedom (e.g., a predetermined degree of freedom). Accordingly, when the rigid substrate 50a is coupled to the flexible substrate 50b, the extended length of the portion of the rigid substrate 50a supporting the first tab connection portion 510 (hereinafter, referred to as a support portion 50a') may be smaller than the extended length of the first tab connection portion 510. As used herein, the extended length is a distance at which the first tab connection portion 510 protrudes from the end of the flexible substrate 50b. In other embodiments, the support portion 50a' of the rigid substrate 50a may not be fixed to the first tab connection portion 510. For example, the extended length of the support portion 50a' may be the same as the extended length of the first tab connection portion 510.

In addition, similar to the first tab connection portion 510, the second tab connection portion 520 should be able to flow with a degree of freedom (e.g., a predetermined degree of freedom). To this end, the rigid substrate 50a may be shaped so as not to support a portion of the flexible substrate 50b where the second tab connection portion 520 is formed. For example, the rigid substrate 50a may be shaped such that the portion where the second tab connection portion 520 is formed is empty. FIG. 2 shows an embodiment in which the portion of the rigid substrate 50a corresponding to the second tab connection portion 520 of the flexible substrate 50b is empty.

As shown in FIGS. 4 and 5, the substrate tab 530 is a metal tab for connecting the first tab connection portion 510 and the second tab connection portion 520 to the busbars 40, respectively. For example, the substrate tab 530 may be made of a nickel material. The substrate tab 530 may include a plurality of substrate tabs, and they may have a substantially rectangular shape. One end of the substrate tab 530 is coupled to the first tab connection portion 510 or the second tab connection portion 520, and the other end thereof extends to the outside of the first tab connection portion 510 or the second tab connection portion 520. Part or all of a region of the substrate tab 530, except for one end thereof, may be coupled to the busbars 40. One end of the substrate tab 530 that is coupled to the first tab connection portion 510 or the second tab connection portion 520 may be defined as a first welding portion 532, and the remaining portion may be defined as a second welding portion 534. For example, the first welding portion 532 may be connected to the first tab connection portion 510 or the second tab connection portion 520 by soldering, and the second welding portion 534 may be connected to the busbar 40 by laser welding. However, both the first welding portion 532 and the second welding portion 534 may be welded by ultrasonic welding or laser welding. For example, when the first welding portion 532 and the second welding portion 534 are physically coupled (e.g., are integrally formed) and electrically connected to the first tab connection portion 510, the second tab connection portion 520, or the busbars 40, the coupling method is not limited. In addition, the first welding portion 532 and the second welding portion 534 may have different shapes than those shown in the drawings, which are provided by way of example. In other words, the shapes if the first welding portion 532 and the second welding portion 534 are not limited thereto.

As described above, because the flexible substrate 50b and the busbar 40 are electrically connected by the substrate tab 530, a bolting process and bolting parts for connecting the substrate and the busbar holder 30 may be omitted. In addition, tox clinching, which is a type of riveting process for bonding dissimilar metals, for connecting a substrate and the busbars 40 may be omitted. Therefore, the assembly quality is improved, the quality can be stabilized, and the cost can be reduced by the omission of parts.

Figure 6A:
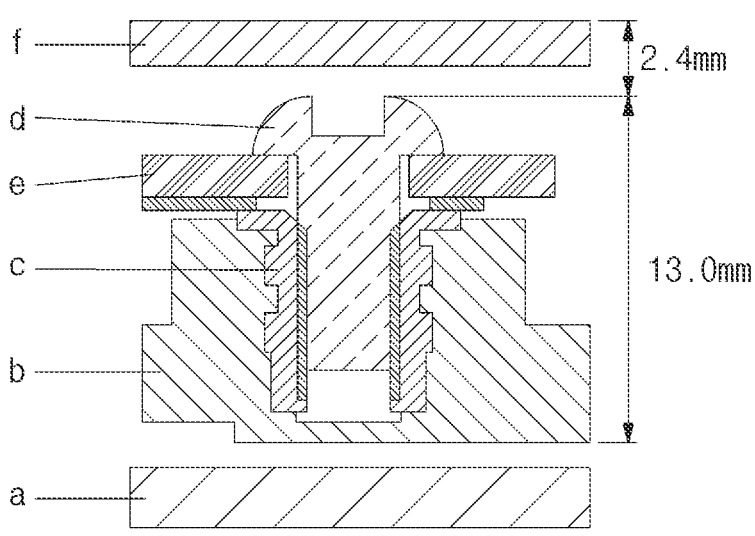
FIG. 6A is a cross-sectional view schematically illustrating a state in which a conventional busbar holder and a rigid circuit board are coupled.
Figure 6B:
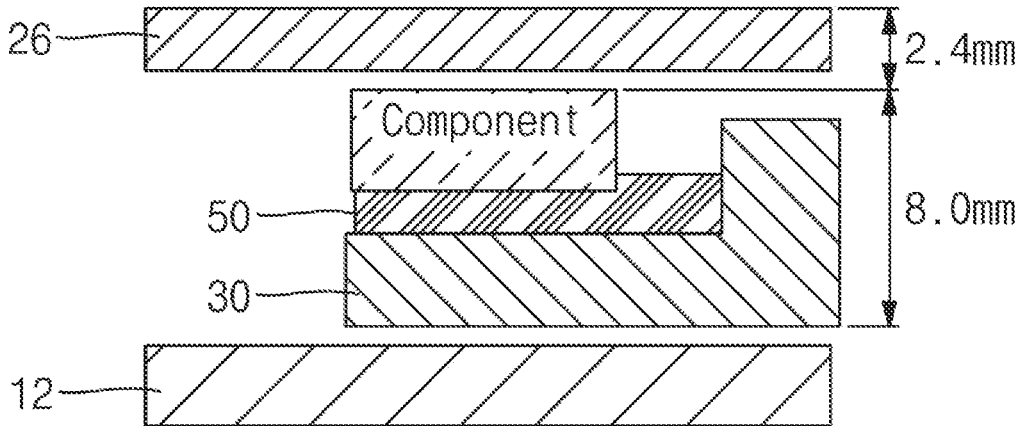
FIG. 6B is a cross-sectional view schematically illustrating a coupling state between a busbar holder and a hybrid circuit board of a battery pack according to an embodiment of the present disclosure.

FIG. 6A is a cross-sectional view schematically illustrating a state in which a conventional busbar holder and a rigid circuit board are coupled. FIG. 6B is a cross-sectional view schematically illustrating a coupling state between a busbar holder and a hybrid circuit board of a battery pack according to an embodiment of the present disclosure.

As shown in FIG. 6A, conventionally, a busbar holder (b) is disposed on a cell cap (a), a rigid circuit board (e) is placed on the busbar holder (b), and the rigid circuit board (e) is then fixed to the busbar holder (b) by using an insert nut (c) and a bolt (d). Thereafter, a top plate (f) is fastened on the rigid circuit board (e). For example, a height ranging from the top plate (f) to the head of the bolt (d) may be about 2.4 mm, and a height ranging from the head of the bolt (d) to the bottom of the busbar holder (b) may be about 13 mm (hereinafter, the sum of the two heights is defined as a module height). That is, in the conventional structure, the module height is about 15.4 mm.

In contrast, when the hybrid circuit board 50 according to embodiments of the present disclosure is applied, the coupling structure is, according to an embodiment, as shown in FIG. 6B. As shown in FIG. 6B, a busbar holder 30 is placed on a cell cap 12, and a hybrid circuit board 50 on which components are mounted is placed on the busbar holder 30. Thereafter, a top plate 26 is disposed on the hybrid circuit board 50. For example, a height ranging from the top plate 26 to the top end of a component mounted on the hybrid circuit board 50 may be about 2.4 mm, and a height ranging from the top end of the component mounted on the hybrid circuit board 50 to the bottom of the busbar holder 30 may be about 8 mm. Therefore, the module height according an embodiment of the present disclosure is about 10.4 mm, and thus, the module height can be greatly reduced compared to the conventional structure shown in FIG. 6A.

Hereinafter, a structure of a hybrid circuit board according to another embodiment of the present disclosure will be described, and a detailed description of the same configuration as that of the previous embodiment will be omitted.

Figure 7:
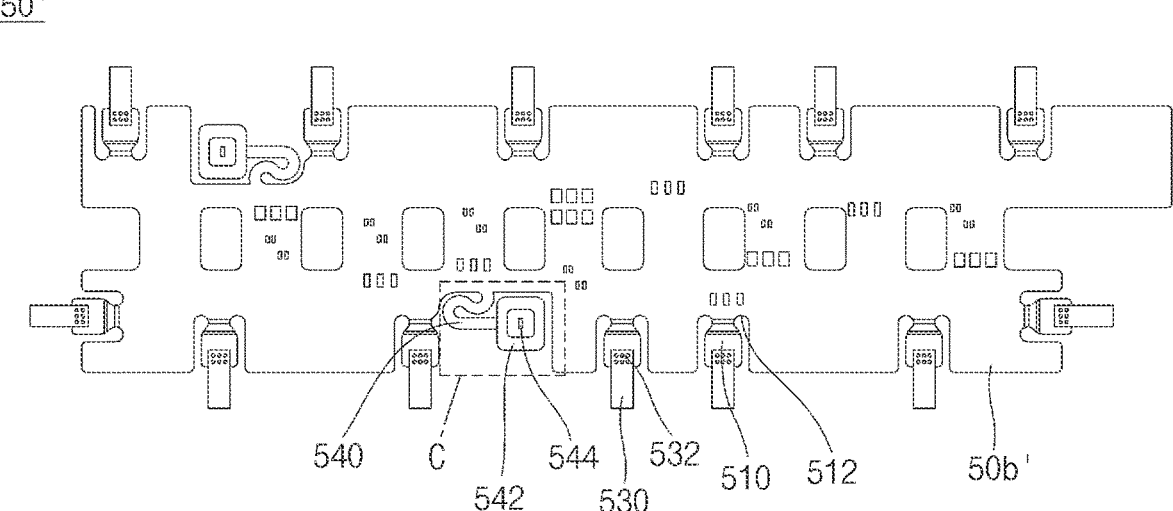
FIG. 7 is a plan view of a hybrid circuit board according to another embodiment of the present disclosure.
Figure 8:
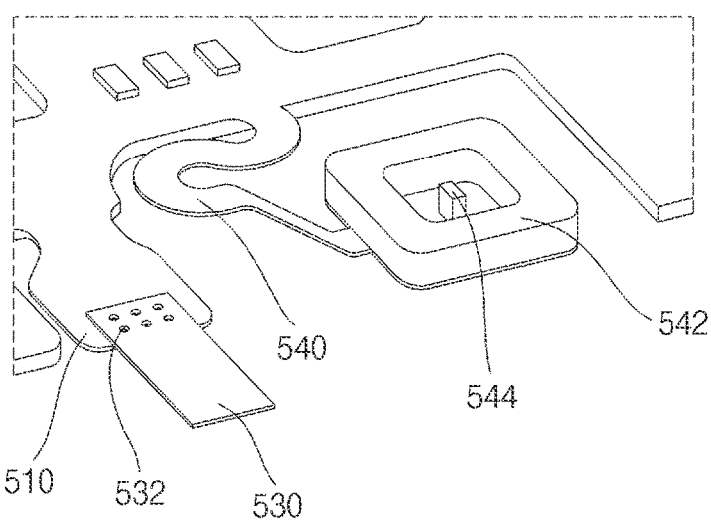
FIG. 8 is an enlarged perspective view of the portion "C" of FIG. 7.
Figure 9:
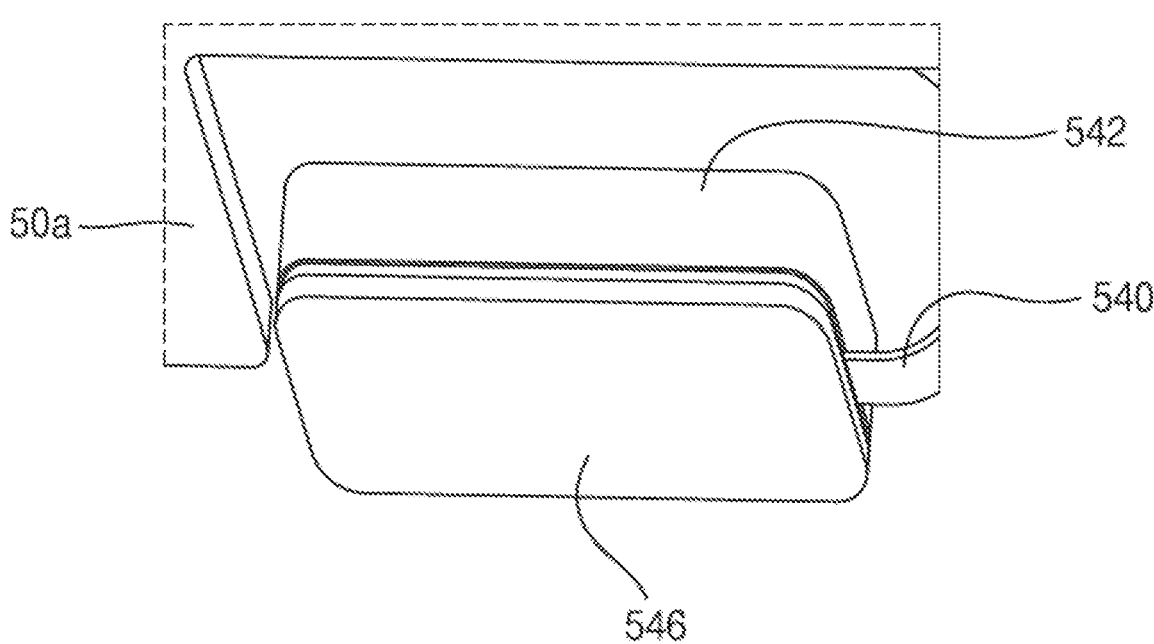
FIG. 9 is an enlarged bottom perspective view of portions of the portion "C" shown in FIG. 8.

FIG. 7 is a plan view of a hybrid circuit board according to another embodiment of the present disclosure, FIG. 8 is an enlarged perspective view of the portion "C" of FIG. 7, and FIG. 9 is an enlarged bottom perspective view of portions of the portion "C" shown in FIG. 8.

As shown in FIG. 7, in the hybrid circuit board 50' according to another embodiment of the present disclosure, a plurality of first tab connection portions 510 and a sensor connection portion 540 may be formed on a flexible substrate 50b'. Here, the first tab connection portion 510 may have the same shape and structure as that shown in FIG. 4. As shown in FIG. 7, however, the substrate tab 530 may be formed in a rectangular shape without a separate welding portion. A similar configuration of the substrate tab 530 may also be applied to the embodiment shown in FIG. 4.

The sensor connection portion 540 may extend from one edge of the flexible substrate 50b' in an approximately 'S' shape. A foam pad 542 on which a temperature sensor 544 is mounted may be coupled to the extended (or distal) end of the sensor connection portion 540. The foam pad 542 has a hexahedron shape having a thickness (e.g., a predetermined thickness), and an accommodation space in which the temperature sensor 544 is mounted may be formed on (or in) the foam pad 542. For example, the foam pad 542 may be formed to surround (e.g., to surround in a plan view or to extend around a periphery of) the temperature sensor 544. A metal tab 546 (see, e.g., FIG. 9) electrically connected to the temperature sensor 544 and connected to the battery cell 10 or the cell cap 12 may be coupled to the lower portion of the foam pad 542 in the direction facing the busbar 40. For example, the metal tab 546 may be made of an aluminum material. The temperature of the battery cell 10 may be measured by attaching the metal tab 546 to the surface of the battery cell 10 by using a double-sided tape or the like. Accordingly, the shape and length of the sensor connection portion 540 may vary depending on a position to which the metal tab 546 is attached. By including the sensor connection portion 540, the processes and parts for connecting a temperature sensor to a board with a separate connector and wire, and welding the temperature sensor to a battery cell and installing the same, may be omitted. Accordingly, the cost can be reduced and the process can be simplified due to omission of parts. The above-described sensor connection portion 540 may also be applied to the hybrid circuit board 50 shown in FIG. 3.

In the hybrid circuit board according to embodiments of the present disclosure having the above-described structure, components are not mounted on the edge of a flexible board having a swelling absorption structure formed thereon. The component is mounted on a portion that is less affected by swelling and is supported by a rigid substrate. For example, components may be disposed at a central portion spaced apart from the edge along the longitudinal direction of the flexible substrate.

According to embodiments of the present disclosure, by having both the characteristics of a rigid circuit board and a flexible circuit board, the rigidity of the substrate can be reinforced.

In addition, the hybrid circuit board according to embodiments of the present disclosure has a swelling absorption structure and can be connected to the busbar without a bolting process, and thus, a separate swelling absorption structure may be omitted and the busbar connection structure can be simplified. Accordingly, a cause of increased height of a battery pack is eliminated, thereby enabling a battery pack having a reduced or minimum height.

While the foregoing embodiments are only some embodiments for carrying out the present disclosure, which is not limited to these embodiments, it will be understood by a person skilled in the art that various changes in form and details may be made therein without departing from the spirit and scope of the present disclosure as defined by the following claims and their equivalents.

What is claimed is:

1. A hybrid circuit board comprising:
    a flexible substrate comprising a flexible material and a plurality of tab connection portions extending outwardly from an edge of the flexible material, the tab connection portions being electrically connected to a plurality of busbars, the busbars electrically connecting a plurality of battery cells; and
    a rigid substrate comprising a rigid material, the rigid substrate being coupled to the flexible substrate to support the flexible substrate,
    wherein the flexible substrate has a first shape portion formed at both sides of a first tab connection portion from among the tab connection portions, the first shape portion being concavely cut inwardly from the edge of the flexible substrate, and
    wherein the rigid substrate has a support portion supporting only a proximal portion of the first tab connection portion at where it connects to the flexible substrate.

2. The hybrid circuit board of claim 1,
    wherein a substrate tab is electrically connected to each of the tab connection portions and the busbars.

3. The hybrid circuit board of claim 2, wherein one end of each of the substrate tabs is soldered to a corresponding one of the tab connection portions, and the other end thereof is laser-welded to one of the busbars.

4. The hybrid circuit board of claim 2, wherein the flexible substrate has a second shape portion extending from the edge of the flexible substrate in an 'S' shape and being integrally formed with a second tab connection portion from among the tab connection portions.

5. The hybrid circuit board of claim 2, further comprising a sensor connection portion extending in an 'S' shape from the edge of the flexible substrate,
    wherein the sensor connection portion comprises:
        a temperature sensor configured to measure a temperature of at least one of the battery cells;
        a foam pad accommodating the temperature sensor; and
        a metal tab coupled to the foam pad and connected to the temperature sensor and the at least one of the battery cells.

6. A battery pack comprising:
    a plurality of battery cells arranged in one direction, each of the battery cells comprising a positive electrode terminal and a negative electrode terminal;
    a plurality of busbars electrically connected to the positive electrode terminal or the negative electrode terminal of each of the battery cells; and
    a hybrid circuit board comprising a rigid substrate and a flexible substrate coupled to the rigid substrate and comprising a plurality of tab connection portions extending outwardly from edges of the flexible substrate and electrically connected to the busbars, the rigid substrate being between the busbars and the flexible substrate, wherein the flexible substrate has a first shape portion at both sides of at least one of the tab connection portions, the first shape portion being concavely cut inwardly from one of the corresponding edges of the flexible substrate, and wherein the rigid substrate has a support portion supporting only a proximal portion of the at least one of the tab connection portions at where the at least one of the tab connection portions connects to the flexible substrate.

7. The battery pack of claim 6, wherein the flexible substrate comprises a substrate tab electrically connected to each of the tab connection portions and one of the busbars.

8. The battery pack of claim 7, wherein the flexible substrate has a second shape portion extending from one of the edges of the flexible substrate in an 'S' shape and integrally formed with another one of the tab connection portions.

9. The battery pack of claim 7, wherein one end of the substrate tab is soldered to a corresponding one of the tab connection portions, and the other end thereof is laser-welded to one of the busbars.

10. The battery pack of claim 9, further comprising a sensor connection portion extending in an 'S' shape from one of the edges of the flexible substrate, wherein the sensor connection portion comprises:
   a temperature sensor configured to measure a temperature of at least one of the battery cells;
   a foam pad accommodating the temperature sensor; and
   a metal tab coupled to the foam pad and connected to the temperature sensor and the at least one of the battery cells.

11. The hybrid circuit board of claim 1, wherein the rigid substrate has a first shape portion formed at both sides of the support portion and corresponding in shape to and overlapping the first shape portion formed in the flexible substrate.

12. The battery pack of claim 6, wherein the rigid substrate has a first shape portion formed at both sides of the support portion and corresponding in shape to and overlapping the first shape portion formed in the flexible substrate.

* * * * *